(12) United States Patent
Seki

(10) Patent No.: US 6,573,751 B1
(45) Date of Patent: Jun. 3, 2003

(54) SEMICONDUCTOR DEVICE AND ELECTRONIC APPARATUS USING THE SAME

(75) Inventor: Hiroshi Seki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/545,933

(22) Filed: Apr. 10, 2000

(30) Foreign Application Priority Data

Apr. 9, 1999 (JP) .............................. 11-102029
Mar. 15, 2000 (JP) ...................... 2000-071971

(51) Int. Cl.[7] ......................................... H03K 19/0175
(52) U.S. Cl. .............................. 326/80; 326/63; 326/80; 257/48
(58) Field of Search ............................ 326/16, 80, 63; 257/48

(56) References Cited

U.S. PATENT DOCUMENTS 6,292,026 B1 * 9/2001 Seki

* cited by examiner

Primary Examiner—Fetsum Abraham
(74) Attorney, Agent, or Firm—Hogan & Hartson, LLP

(57) ABSTRACT

A semiconductor device 100 has a peripheral cell region 102 and an internal cell region. The peripheral cell region is provided with a signal input terminal 110 that inputs input signals having different voltage levels in a normal operation mode and in a test mode starting time; a first transmission circuit 120 that provides the input signal to the internal cell region; and a second transmission circuit 150 that outputs a control signal indicating a test mode when the input signal has a voltage level equivalent to a voltage to be provided when the test mode is started. Also, a control circuit 180 that cuts off current that flows in the second transmission circuit 150 when the input signal has a voltage level to be provided in the normal operation mode. The control circuit 180 includes first and second P-type transistors 182 and 184 formed in a floating N-type well.

20 Claims, 7 Drawing Sheets

SEMICONDUCTOR DEVICE AND ELECTRONIC APPARATUS USING THE SAME

BACKGROUND OF THE INVENTION

1. Technical Field of the Invention

The present invention relates to a semiconductor device that is capable of performing a normal operation mode and a test mode, and to an electronic apparatus using the semiconductor device. More particularly, the present invention relates to a semiconductor device such as a gate array that does not require a test pin.

2. Description of Related Art

Conventionally, an integrated circuit (IC) having a function to test its internal circuit is provided with test pins that are exclusively used to control switching between a test mode and a normal operation mode. The test mode is conducted by the IC manufacturer to determine the acceptability of integrated circuits before they are shipped out. Therefore, the test pints are not required by the user who purchases the ICs.

The number of pins on an IC is restricted by the circuit size and the specification of the IC. In some cases, no space may be available to provide test pins exclusively used for the test. If this happens, and an IC has a plurality of power source pins, the number of the power source pins is reduced, and test pins are provided in place of the reduced power source pins. However, when the number of test pins cannot be reduced because of, for example, the user's specification, the IC manufacture has to give up implementing the test mode.

Japanese Laid-open patent application HEI 2-62783 describes a semiconductor memory device having an aging mode and a plural-bit parallel test mode. The reference describes that the aging mode and the test mode can be simultaneously conducted only when a voltage higher than a predetermined voltage, e.g., a power supply voltage is applied to pins that become unnecessary in the aging mode and the test mode.

FIG. 7 shows a circuit diagram of a conventional semiconductor device of the type described in the reference. In the semiconductor device in FIG. 7, an input signal that is applied to an input terminal 10 is supplied to internal cells through inversion buffer circuits 12 and 14. In the normal operation mode, an input signal has voltage levels ranging from 0 V to a power supply voltage $V_{DD}$. On the other hand, when the test mode is started, an input signal inputted in the input terminal 10 has a high voltage $HV_{DD}$. The high voltage $HV_{DD}$ is provided through K number (K=3 in FIG. 7) of N-type transistors 20, 22 and 24 to an inversion buffer circuit 30 that is formed from a P-type transistor 32 and an N-type transistor 34. Further, an output from the inversion buffer circuit 30 is inputted in an inversion buffer circuit 40 that is formed from a P-type transistor 42 and an N-type transistor 44. An output from the inversion buffer circuit 40 is a test control signal.

When a threshold voltage of each of the N-type transistors 20, 22 and 24 is $V_{THN}$, and an inverse logic level of the inversion buffer circuit 30 is $V_{INV}$, the following conditions need to be met:

$$V_{DD} - K \cdot V_{THN} < V_{INV} \quad (1)$$

$$HV_{DD} - K \cdot V_{THN} > V_{INV} \quad (2)$$

When the formula (1) is satisfied, an input signal having a voltage lower than the power supply voltage $V_{DD}$ functions only as an input signal to the internal cells (in the normal operation mode). When the formula (2) is satisfied, an input signal having a high voltage $HV_{DD}$ functions as a test control signal, such that the semiconductor device goes in the test mode.

However, in the semiconductor device shown in FIG. 7, when an input signal having a voltage equal to the power supply voltage $V_{DD}$ is applied to the input terminal in the normal operation mode, a drain current (through-current) of several mA flows through the inversion buffer circuit 30. When this type of through-current flows in the normal operation mode, the power consumption is increased.

Semiconductor devices similar to the semiconductor device shown in FIG. 7 are described in Japanese Laid-open patent applications SHO 61-292755, HEI 1-245499 and HEI 2-3145. They suffer similar problems in that the power consumption likewise increases in the normal operation mode.

SUMMARY OF THE INVENTION

In view of the above, it is an object of the present invention to provide a semiconductor device in which its normal input pins are provided with a function of test pins, but the power consumption does not increase in the normal operation mode.

A semiconductor device in accordance with one embodiment of the present invention has a peripheral cell region and an internal cell region. The peripheral cell region comprises; a signal input terminal that inputs input signals having different voltage levels in a normal operation mode and when a test mode is started; a first transmission circuit that outputs the input signal in the internal cell region; a second transmission circuit that outputs a control signal indicating a test mode when the input signal has a voltage level equivalent to a voltage to be provided at starting the test mode; and a control circuit that cuts off current that flows in the second transmission circuit when the input signal has a voltage level to be provided in the normal operation mode.

In one embodiment of the present invention, a signal input terminal is commonly used in the normal operation mode and the test mode, and an input to the signal input terminal is transmitted through the first transmission circuit to the internal cell region. When an input signal having a voltage level that is different from a voltage level in the normal operation mode is inputted when the test mode is started, a control signal indicating the test mode is outputted from the second transmission circuit. However, when an input signal has a voltage level that is equal to a voltage level provided in the normal operation mode, the current that flows in the second transmission circuit is cut off by the control circuit. As a result, the power consumption is not increased.

The second transmission circuit outputs a control signal indicating the test mode when the input signal has a voltage level higher than a predetermined voltage level. The control circuit cuts off current flowing through the second transmission circuit when the input signal has a voltage level lower than the predetermined voltage level.

In this case, the control circuit may preferably include a first P-type transistor formed in a floating N-type well. A power supply voltage is provided to a gate of the first P-type transistor, a source of the first P-type transistor connects to the signal input terminal, and a drain of the first P-type transistor connects to an input terminal of the second transmission circuit.

In the normal operation mode, the first P-type transistor is turned off, and thus the current flowing through the second transmission circuit is cut off. The first P-type transistor is turned on when the test mode is started. However, since the P-type transistor is formed in the floating N-type well, no leakage current flows.

The control circuit may preferably include a second P-type transistor formed in the floating N-type well. The input signal is supplied to a gate of the second P-type transistor, the power supply voltage is supplied to a source of the second P-type transistor, and a drain of the second P-type transistor connects to the N-type well. The second P-type transistor is turned on during the normal operation mode, such that the potential of the floating N-type well is clamped generally at the power supply voltage.

When this type of P-type transistor is used, the predetermined voltage level may be set at a voltage level higher than the power supply voltage. As a result, the first P-type transistor can be turned on when the test mode is started.

The second transmission circuit may be structured to output a control signal indicating the test mode when the input signal has a voltage level lower than a predetermined voltage level. The control circuit may be structured to cut off current flowing through the second transmission circuit when the input signal has a voltage level that exceeds the predetermined voltage level. In this case, the control circuit may preferably have first and second N-type transistors formed in a floating P-type well. In this case, when the predetermined voltage level is lower than the level of the power supply voltage, the first N-type transistor can be turned on when the test mode is started.

Each of the first and second transmission circuits may be composed of a buffer circuit. As a result, an accurate logic can be transmitted in a short time even when the transmission path is long.

An electronic apparatus in accordance with another embodiment can implement therein a semiconductor device described above. The electronic apparatus can reduce its power consumption. Therefore, the electronic apparatus of the present invention may preferably be implemented in hand-carry type electronic apparatuses.

Other features and advantages of the invention will be apparent from the following detailed description, taken in conjunction with the accompanying drawings, which illustrate, by way of example, various features of embodiments of the invention.

PREFERRED EMBODIMENTS

Embodiments of the present invention will be described below with reference to the accompanying drawings.

Figure 6:
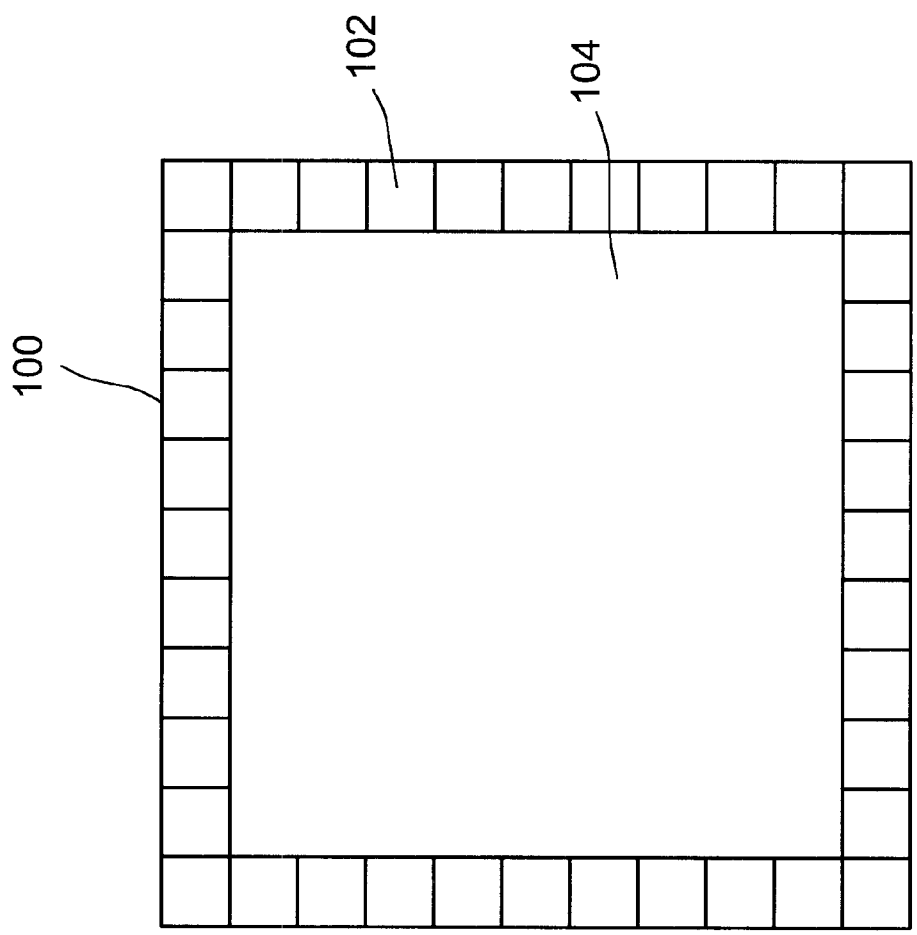
FIG. 6 is a schematic plan view of a semiconductor device in which the present invention is applied.
Figure 7:
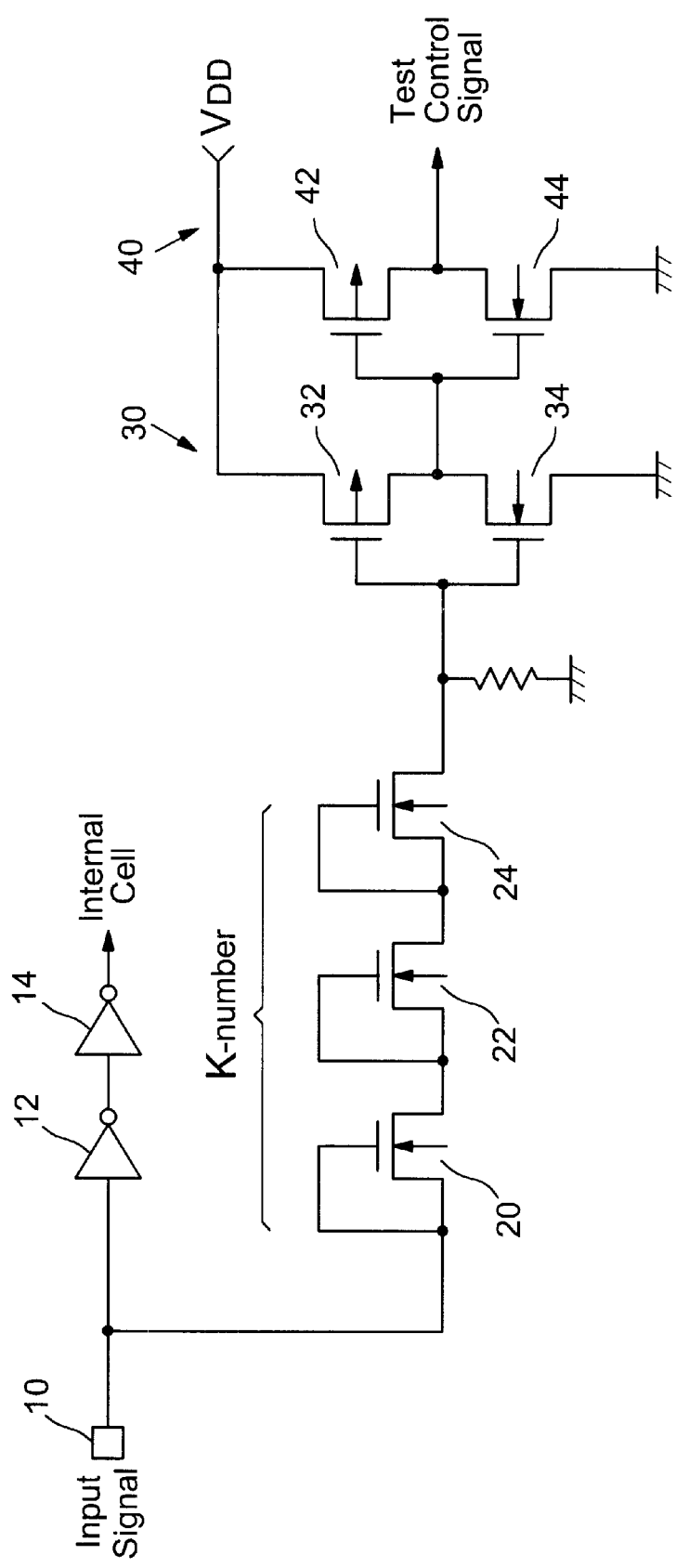
FIG. 7 is a circuit diagram of a conventional semiconductor device.

FIG. 6 is a schematic plan view of a semiconductor device 100, such as, a gate array and the like. The semiconductor device 100 has a peripheral cell region 102 and an internal cell region 104.

Many MOS transistors are provided in a high integration in an internal cell region 104. A variety of logic cells (internal cells) are realized by wiring the MOS transistors.

The peripheral cell region 102 is provided with a function that inputs and outputs signals through signal terminals and a function that inputs a power supply voltage through power supply terminals. The peripheral cell region 102 is designed with heavy emphasis on its drivability. Circuits disposed in the peripheral cell region have the drivability sufficiently resistive to the capacitance of external wirings such as wire bonding and the like, as well as a protective function against electrostatics from the external terminals.

Figure 1:
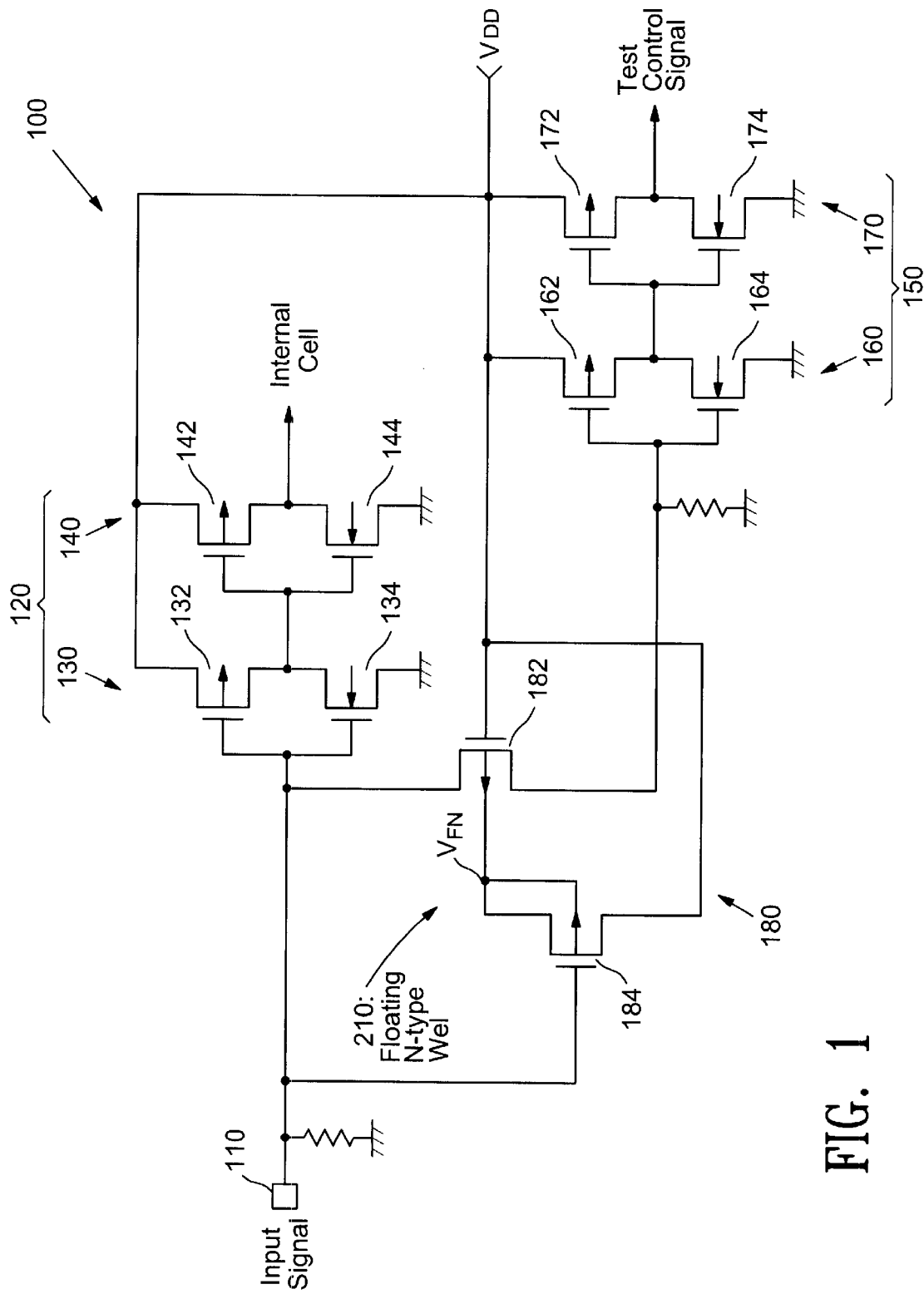
FIG. 1 shows a circuit diagram of a semiconductor device in accordance with one embodiment of the present invention.

FIG. 1 shows a circuit diagram of a part of the peripheral cell region 102 of the semiconductor device 100 shown in FIG. 6. The peripheral cell region 102 has an input signal terminal 110 that inputs input signals having different voltage levels during the normal operation mode and when the test mode is started; a first transmission circuit 120 that provides the input signal to the internal cell region; a second transmission circuit 150 that outputs a control signal indicating the test mode, when the input signal has a voltage level that is to be provided at the time of starting the test mode; and a control circuit 180 that cuts off current that flows through the second transmission circuit 150 when the input signal has a voltage level that is to be provided during the normal operation mode.

The first transmission circuit 120 has an inversion buffer circuit 130 formed from a P-type transistor 132 and an N-type transistor 134, and an inversion buffer circuit 140 formed from a P-type transistor 142 and an N-type transistor 144. The two inversion buffer circuits 130 and 140 form a buffer circuit. An input signal that is applied to the signal input terminal 110 is supplied to internal cells through the first transmission circuit 120.

In the normal operation mode, an input signal has a voltage ranging between a reference voltage (0 V in the present embodiment) and a power supply voltage $V_{DD}$. On the other hand, when the operation goes into the test mode (starting of the test mode), an input signal having a high voltage $HV_{DD}$ greater than the power supply voltage $V_{DD}$ is applied to the input terminal 110.

Only at the starting of the test mode, the second transmission circuit 150 provides a control signal that indicates the test mode. However, in the normal operation mode (including the test mode succeeding the starting of the test mode) other than the starting of the test mode, current that flows through the second transmission circuit 150 is cut off by the control signal 180.

The second transmission circuit 150 has an inversion buffer circuit 160 formed from a P-type transistor 162 and an N-type transistor 164, and an inversion buffer circuit 170 formed from a P-type transistor 172 and an N-type transistor 174. The two inversion buffer circuits 160 and 170 form a buffer circuit. It is noted that the second transmission circuit 150 may also include other inversion buffer circuits other than the inversion buffer circuits 160 and 170.

The control circuit 180 includes first and second P-type transistors 182 and 184 that are formed in a floating N-type well.

A source of the first P-type transistor 182 connects to the signal input terminal 110, and its gate is supplied with the power supply voltage $V_{DD}$. When a high voltage $HV_{DD}$ is applied to the source, the first P-type transistor 182 turns ON. A voltage outputted from the drain of the first P-type transistor 182 is provided to the inversion buffer circuit 160 of the second transmission circuit 150.

The second P-type transistor 184 provided in the floating N-type well clamps a floating potential $V_{FN}$ of the floating N-type well at the power supply voltage $V_{DD}$. Its operation will be described in a greater detail below.

Transistors other than the second P-type transistors 182 and 184 that are provided in the control circuit 180 do not need to be formed in the floating N-type well. They can be formed in a normal N-type well.

When the threshold voltage of the first P-type transistor 182 is $V_{THP}$, the following conditions need to be met so that the first P-type transistor 182 turns on:

$$HV_{DD} - V_{THP} > V_{DD} \quad (3)$$

Namely, when an input signal has a voltage level lower than "$V_{DD}+V_{THP}$", the input signal solely acts as an input signal to be provided to the internal cells (in the normal operation mode). When an input signal has a voltage level higher than "$V_{DD}+V_{THP}$", the input signal acts as a test control signal, so that the semiconductor device goes into the test mode.

In accordance with one aspect of the present embodiment, when an input signal having a voltage level lower than "$V_{DD}+V_{THP}$" is applied to the signal input terminal 110 in the normal operation mode, the drain voltage of the first P-type transistor 182 lowers to the reference voltage (0 V). As a result, static current does not flow through the inversion buffer circuit 160 in the second transmission circuit 150. Furthermore, static current does not increase even in the test mode. These characteristics will be described in greater detail with reference to FIGS. 2 and 3.

Figure 2:
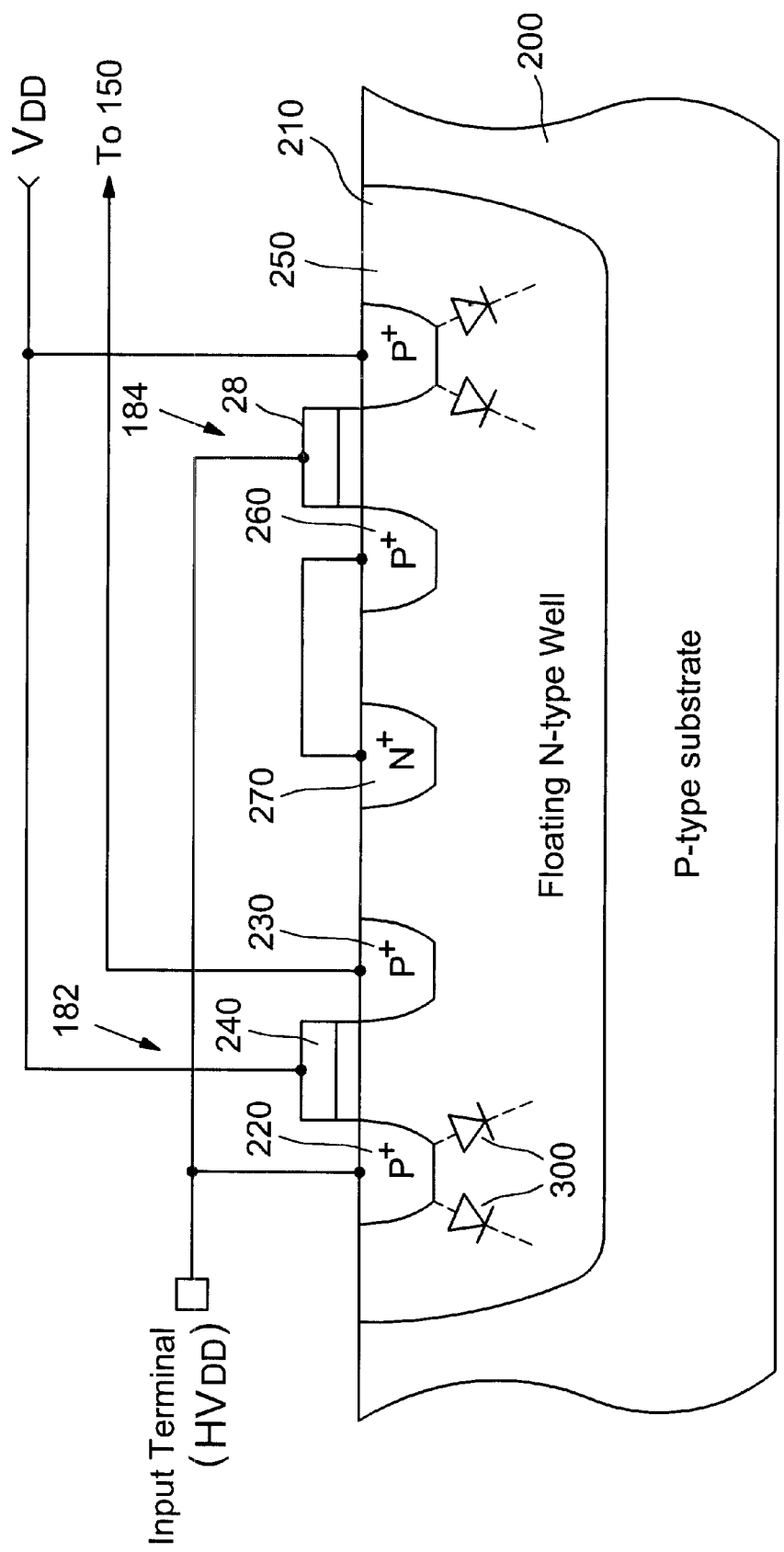
FIG. 2 is a partial cross-sectional view of the semiconductor device shown in FIG. 1.

FIG. 2 is a cross-sectional view of a part of the semiconductor device shown in FIG. 1. Referring to FIG. 2, a floating N-type well 210 is formed in a P-type substrate 200. A source 220 and a drain 230 of the first P-type transistor 182 and a source 250 and a drain 260 of the second P-type transistor 184 are formed in the floating N-type well 210. The drain 260 of the second P-type transistor 184 is coupled to the floating N-type well 210 through an N⁺ diffusion layer 270. Furthermore, a gate electrode 240 of the first P-type transistor and a gate electrode 280 of the second P-type transistor 184 are formed on the floating N-type well 210 through gate insulation films.

It is noted that parasitic diodes 300 are formed between the sources and the drains of the first and second P-type transistors 182 and 184 and the floating N-type well 210.

Figure 3:
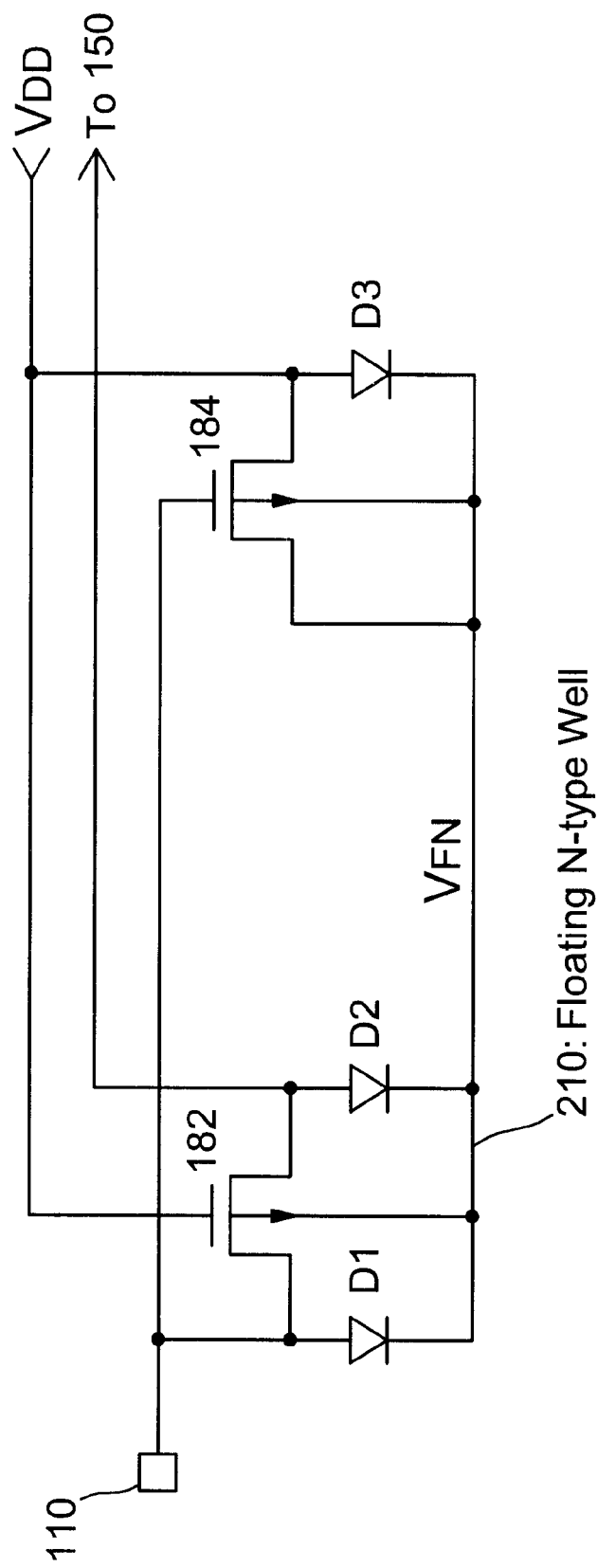
FIG. 3 is an equivalent circuit diagram of the portion of the semiconductor device of FIG. 2.

FIG. 3 shows an equivalent circuit of the first and second P-type transistors 182 and 184 including their parasitic diodes D1 through D3. A second gate of each of the first and second P-type transistors 182 and 184 and a cathode of each of the parasitic diodes D1 through D3 are formed by the floating N-type well 210 and has the floating potential $V_{FN}$.

The floating N-type well 210 is floated from peripheral circuits. Therefore, leakage current does not flow. In other words, when an input signal having a high voltage $HV_{DD}$ is applied to the source of the first P-type transistor 182 at the starting of the test mode, the floating potential $V_{FN}$ of the floating N-type well 210 rises to "$HV_{DD}-V_D$" due to the parasitic diode D1 ($V_D$ is a normal direction voltage of the parasitic diode). At this moment, the other parasitic diodes D2 and D3 are inversely biased, and therefore no current path is generated.

On the other hand, in the normal operation mode, for example, an input signal that has a potential equal to the reference potential (0 V) is applied to the source of the first P-type transistor 182, the floating potential $V_{FN}$ of the floating N-type well is clamped generally at the power supply voltage $V_{DD}$ by a current flowing from the source to the drain of the parasitic diode D3 or the second P-type transistor 184. At this moment, the other parasitic diodes D1 and D2 are inversely biased, and therefore no current path is generated.

It is noted that the present invention is not limited to the above-described embodiments, but a variety of modifications can be made within the scope of the subject matter of the present invention.

The present invention is also applicable when an input signal that is inputted in the signal input terminal 110 has a voltage between the reference voltage $V_{DD}$ and the power supply voltage $V_{SS}$ (=0 V) in the normal operation mode, and it has an extremely low voltage $LV_{SS}$ (<0) at the starting of the test mode.

Figure 4:
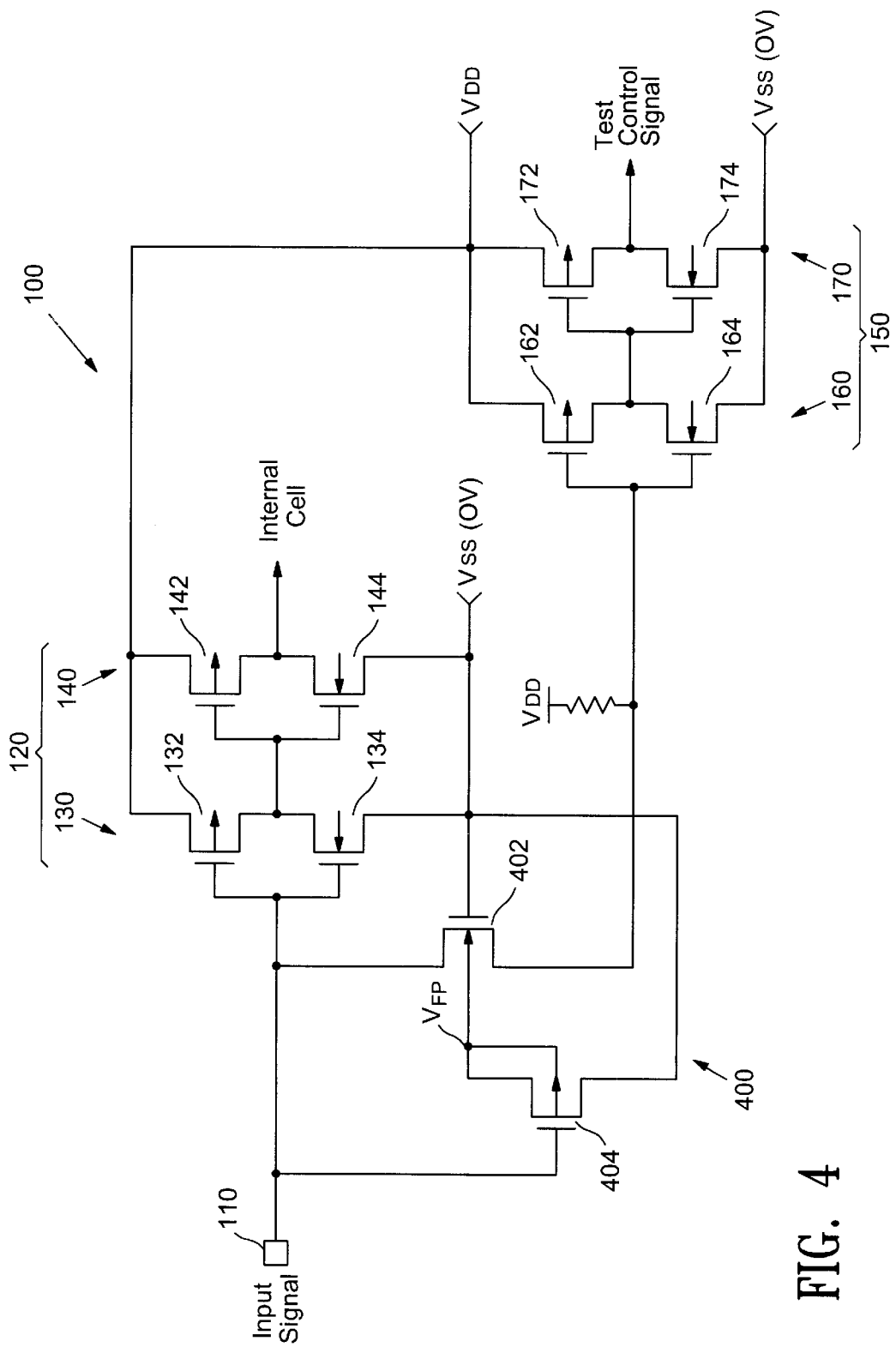
FIG. 4 shows a circuit diagram of a semiconductor device in accordance with another embodiment of the present invention.

FIG. 4 is a circuit diagram of a semiconductor device in accordance with another embodiment of the present invention that is applicable to the situation described above. In FIG. 4, elements that are same as those shown in FIG. 1 are indicated with the same reference numerals and their description is omitted. Referring to FIG. 4, a control circuit 400 is provided in place of the control circuit 180 shown in FIG. 1.

The control circuit 400 includes first and second N-type transistors 402 and 404 that are formed in the floating P-type well.

A source of the first N-type transistor 402 connects to the signal input terminal 110, and a gate thereof is supplied with the power supply voltage $V_{SS}$. When a low voltage $LV_{SS}$ is applied to the source, the first N-type transistor 402 turns ON. A voltage outputted from the drain of the first N-type transistor is inputted in the inversion buffer 160 of the second transmission circuit 150.

The second N-type transistor 404 provided in the floating P-type well clamps the floating potential $V_{FP}$ of the floating P-type well at the power supply voltage $V_{SS}$, when the signal input terminal 110 assumes the reference voltage $V_{DD}$.

When the threshold voltage of the first N-type transistor 402 is $V_{THN}$, the following conditions need to be satisfied in order that the first N-type transistor 402 turns ON:

$$LV_{SS}+V_{THN} < V_{SS} \quad (4)$$

Namely, an input signal having a voltage level higher than "$V_{SS}-V_{THN}$" acts only as an input signal for the internal cells (in the normal operation mode). An input signal having a voltage level lower than "$V_{SS}-V_{THN}$" acts as a test control signal, such that the semiconductor device is placed in the test mode.

Figure 5:
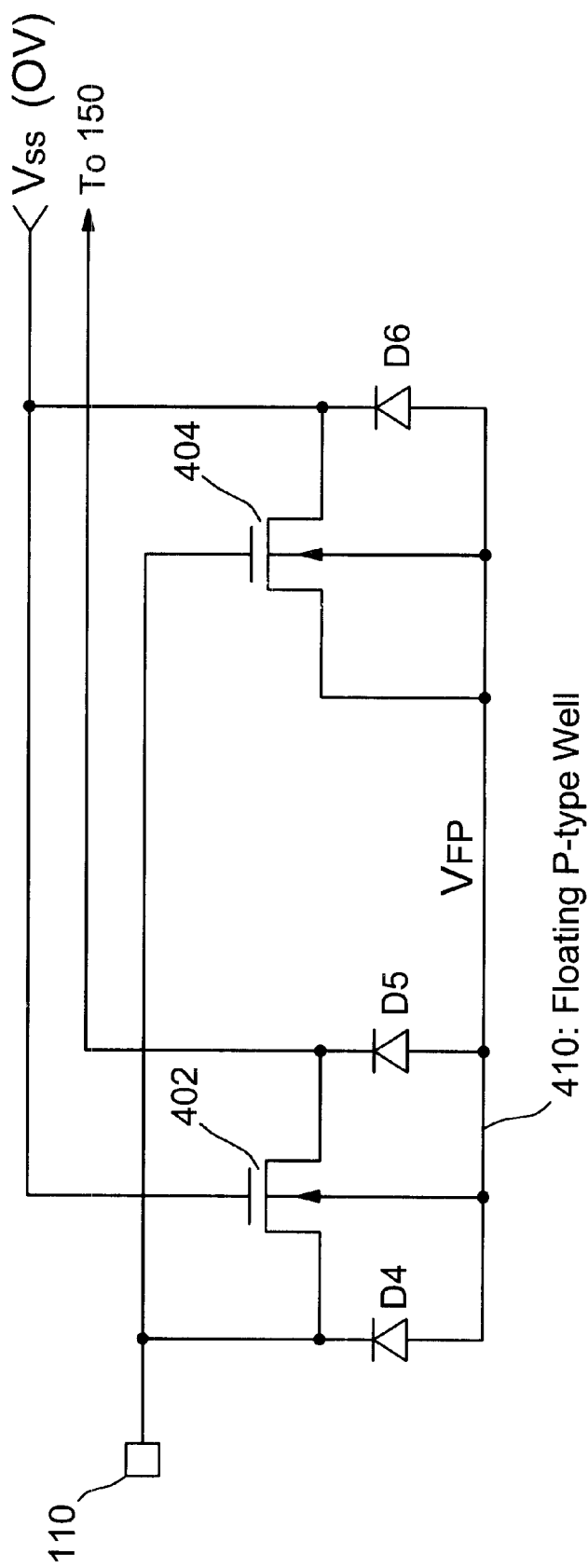
FIG. 5 is an equivalent circuit diagram of the portion of the semiconductor device of FIG. 4.

FIG. 5 is an equivalent circuit of the first and second N-type transistors 402 and 404 including their parasitic diodes D4 through D6. A second gate of each of the first and second N-type transistors 402 and 404 and an anode of each of the parasitic diodes D4 through D6 are formed by the floating P-type well 410 and has the floating potential $V_{FP}$.

The floating P-type well-410 is floated from peripheral circuits. Therefore, leakage current does not flow. In other words, when an input signal having a low voltage $LV_{SS}$ is applied to the source of the first N-type transistor 402 at the starting of the test mode, the floating potential $V_{FP}$ of the floating P-type well 410 lowers to "$LV_{SS}+V_D$" due to the parasitic diode D4 ($V_D$ is a normal direction voltage of the parasitic diode). At this moment, the other parasitic diodes D5 and D6 are inversely biased, and therefore no current path is generated.

On the other hand, in the normal operation mode, when an input signal having a voltage equal to the reference voltage $V_{DD}$, for example, is applied to the source of the first N-type transistor 402, the floating potential $V_{FP}$ of the floating P-type well is clamped generally at the power supply voltage $V_{SS}$ by a current flowing from the source of the second N-type transistor 404 to the drain thereof. At this moment, the other parasitic diodes D4 and D5 are inversely biased, and therefore no current path is generated.

The embodiment is described with reference to an example having two stages of serially connected inversion buffers for the transmission of an input signal. However, instead of the two stages of serially connected inversion buffers, any other transmission circuits using, for example, AND circuits and OR circuits may be used.

In the above-described embodiment, in the test mode, the test signal is used, for example, to pull-up or pull-down the input terminal, or used for other control purposes.

In accordance with the present invention, the semiconductor device described above can be mounted in an electronic device. As a result, the electronic device has low power consumption. In particular, the semiconductor devices described above can be applied to hand-carry type electronic apparatuses, such as phones, mobile computers, electronic notebooks and the like.

While the description above refers to particular embodiments of the present invention, it will be understood that many modifications may be made without departing the spirit thereof. The accompanying claims are intended to cover such modifications as would fall within the true scope and spirit of the present invention.

The presently disclosed embodiments, are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device comprising:
   a peripheral cell region and an internal cell region, wherein the peripheral cell region comprises;
   a signal input terminal that inputs input signals having different voltage levels in a normal operation mode and when a test mode is started;
   a first transmission circuit that outputs the input signal in the internal cell region;
   a second transmission circuit that outputs a control signal indicating a test mode when the input signal has a voltage level equivalent to a voltage to be provided when the test mode is started; and
   a control circuit that cuts off current that flows in the second transmission circuit when the input signal has a voltage level to be provided in the normal operation mode.

2. A semiconductor device according to claim 1, wherein the second transmission circuit outputs a control signal indicating the test mode when the input signal has a voltage level higher than a predetermined voltage level, and the control circuit cuts off current flowing through the second transmission circuit when the input signal has a voltage level lower than the predetermined voltage level.

3. A semiconductor device according to claim 2, wherein the control circuit includes a first P-type transistor formed in a floating N-type well, wherein a power supply voltage is, supplied to a gate of the first P-type transistor, a source of the first P-type transistor connects to the signal input terminal, and a drain of the first P-type transistor connects to an input terminal of the second transmission circuit.

4. A semiconductor device according to claim 3, wherein the control circuit includes a second P-type transistor formed in the floating N-type well, wherein the input signal is supplied to a gate of the second P-type transistor, the power supply voltage is supplied to a source of the second P-type transistor, and a drain of the second P-type transistor connects to the N-type well.

5. A semiconductor device according to claim 3 or claim 4, wherein the predetermined voltage level is higher than the level of the power supply voltage.

6. A semiconductor device according to claim 1, wherein the second transmission circuit outputs a control signal indicating the test mode when the input signal has a voltage level lower than a predetermined voltage level, and the control circuit cuts off current flowing through the second transmission circuit when the input signal has a voltage level that exceeds the predetermined voltage level.

7. A semiconductor device according to claim 6, wherein the control circuit includes a first N-type transistor formed in a floating P-type well, wherein a power supply voltage is supplied to a gate of the first N-type transistor, a source of the first N-type transistor connects to the input terminal, and an input to the second transmission circuit is supplied to a drain of the first N-type transistor.

8. A semiconductor device according to claim 7, wherein the control circuit includes a second N-type transistor formed in the floating P-type well, wherein the input signal is supplied to a gate of the second N-type transistor, the power supply voltage is supplied to a source of the second N-type transistor, and a drain of the second P-type transistor connects to the P-type well.

9. A semiconductor device according to claim 7 or claim 8, wherein the predetermined voltage level is lower than the level of the power supply voltage.

10. A semiconductor device according to claim 1, wherein each of the first transmission circuit and the second transmission circuit is a buffer circuit.

11. An electronic apparatus having a semiconductor device, the semiconductor device comprising:
    a peripheral cell region and an internal cell region, wherein the peripheral cell region comprises;
    a signal input terminal that inputs input signals having different voltage levels in a normal operation mode and when a test mode is started;
    a first transmission circuit that outputs the input signal in the internal cell region;
    a second transmission circuit that outputs a control signal indicating a test mode when the input signal has a voltage level equivalent to a voltage to be provided when the test mode is started; and
    a control circuit that cuts off current that flows in the second transmission circuit when the input signal has a voltage level to be provided in the normal operation mode.

12. An electronic apparatus according to claim 11, wherein the second transmission circuit outputs a control signal indicating the test mode when the input signal has a voltage level higher than a predetermined voltage level, and the control circuit cuts off current flowing through the second transmission circuit when the input signal has a voltage level lower than the predetermined voltage level.

13. An electronic apparatus according to claim 12, wherein the control circuit includes a first P-type transistor formed in a floating N-type well, wherein a power supply voltage is supplied to a gate of the first P-type transistor, a source of the first P-type transistor connects to the signal input terminal, and a drain of the first P-type transistor connects to an input terminal of the second transmission circuit.

14. An electronic apparatus according to claim 13, wherein the control circuit includes a second P-type transistor formed in the floating N-type well, wherein the input signal is supplied to a gate of the second P-type transistor, the power supply voltage is supplied to a source of the second P-type transistor, and a drain of the second P-type transistor connects to the N-type well.

15. An electronic apparatus according to claim 13 or claim 14, wherein the predetermined voltage level is higher than the level of the power supply voltage.

16. An electronic apparatus according to claim 11, wherein the second transmission circuit outputs a control signal indicating the test mode when the input signal has a voltage level lower than a predetermined voltage level, and the control circuit cuts off current flowing through the second transmission circuit when the input signal has a voltage level that exceeds the predetermined voltage level.

17. An electronic apparatus according to claim 16, wherein the control circuit includes a first N-type transistor formed in a floating P-type well, wherein a power supply voltage is supplied to a gate of the first N-type transistor, a source of the first N-type transistor connects to the input terminal, and an input to the second transmission circuit is supplied to a drain of the first N-type transistor.

18. An electronic apparatus according to claim 17, wherein the control circuit includes a second N-type transistor formed in the floating P-type well, wherein the input signal is supplied to a gate of the second N-type transistor, the power supply voltage is supplied to a source of the second N-type transistor, and a drain of the second P-type transistor connects to the P-type well.

19. An electronic apparatus according to claim 17 or claim 18, wherein the predetermined voltage level is lower than the level of the power supply voltage.

20. An electronic apparatus according to claim 11, wherein each of the first transmission circuit and the second transmission circuit is a buffer circuit.

* * * * *